US 8,844,305 B2

(12) United States Patent
Vartiainen

(10) Patent No.: US 8,844,305 B2
(45) Date of Patent: Sep. 30, 2014

(54) INSTRUMENT CABINET

(75) Inventor: Sami Vartiainen, Helsinki (FI)

(73) Assignee: ABB Oy, Helsinki (FI)

( * ) Notice: Subject to any disclaimer, the term of this patent is extended or adjusted under 35 U.S.C. 154(b) by 2155 days.

(21) Appl. No.: 11/496,425

(22) Filed: Aug. 1, 2006

(65) Prior Publication Data

US 2007/0030651 A1 Feb. 8, 2007

(30) Foreign Application Priority Data

Aug. 8, 2005 (FI) .................................... 20055428

(51) Int. Cl.
*F25D 23/12* (2006.01)
*H05K 7/20* (2006.01)

(52) U.S. Cl.
CPC ..................................... *H05K 7/206* (2013.01)
USPC ....................................................... 62/259.2

(58) Field of Classification Search
CPC ..................................................... H05K 7/206
USPC .................. 62/249, 259, 259.2, 259.1, 259.3, 62/259.4; 165/104.33, 104.34, 47; 361/695, 688, 690, 694
See application file for complete search history.

(56) References Cited

U.S. PATENT DOCUMENTS

| 4,236,381 | A | * | 12/1980 | Imral et al. ................... 62/324.1 |
| 4,712,158 | A | * | 12/1987 | Kikuchi et al. ................ 361/699 |
| 5,368,090 | A | * | 11/1994 | Ungar et al. ................... 165/110 |
| 5,657,641 | A | * | 8/1997  | Cunningham et al. .......... 62/263 |
| 6,082,441 | A | * | 7/2000  | Boehmer et al. ............. 165/80.3 |
| 6,088,225 | A | * | 7/2000  | Parry et al. ..................... 361/704 |
| 6,119,768 | A | * | 9/2000  | Dreier et al. ............. 165/104.33 |
| 6,488,214 | B1 | * | 12/2002 | Nicolai et al. ................... 237/69 |
| 6,494,252 | B1 | * | 12/2002 | Takala et al. ............. 165/104.33 |
| 6,535,382 | B2 | * | 3/2003  | Bishop et al. .................. 361/690 |
| 6,662,588 | B2 | * | 12/2003 | Houk et al. ...................... 62/298 |
| 6,688,137 | B1 | * | 2/2004  | Gupte ............................. 62/515 |
| 6,742,582 | B1 | * | 6/2004  | Wheat et al. ................... 165/259 |
| 6,788,535 | B2 | * | 9/2004  | Dodgen et al. ................ 361/695 |

FOREIGN PATENT DOCUMENTS

| DE | 79 30 973 U1 | 2/1980 | |
| DE | 3305126 C2 * | 1/1987 | ............... F28D 7/02 |
| DE | 8702065 U1 * | 5/1987 | ............... H05K 7/20 |
| DE | 87 02 065 U1 | 7/1987 | |
| DE | 41 35 894 C1 | 11/1992 | |
| EP | 1303015 A1 * | 4/2003 | ............... H02B 1/56 |

OTHER PUBLICATIONS

Finland Search Report dated Dec. 14, 2005 (with English translation of category of cited documents).

* cited by examiner

*Primary Examiner* — Frantz Jules
*Assistant Examiner* — Emmanuel Duke
(74) *Attorney, Agent, or Firm* — Buchanan Ingersoll & Rooney PC

(57) ABSTRACT

The invention relates to an instrument cabinet comprising: a wall structure with vertical studs, a fan for cooling electric components to be installed in the instrument cabinet with an airflow produced by the fan, and a cooling element arranged in the airflow and having a flow channel for feeding cooling fluid through the cooling element for cooling the airflow that cools the electric components. To achieve a lower than before instrument cabinet that has fewer risks of leakage, the cooling element is arranged upright and at least partly in the space between the vertical studs.

2 Claims, 2 Drawing Sheets

INSTRUMENT CABINET

CROSS-REFERENCE TO RELATED PATENT APPLICATIONS

This application claims the benefits of Finnish Patent Application No. 20055428, filed on Aug. 8, 2005 in the Finnish Intellectual Property Office, the disclosure of which is incorporated herein in its entirety by reference.

FIELD OF THE INVENTION

This invention relates to a cooling solution of an instrument cabinet that ensures that sufficient cooling is achieved under all conditions for electric components to be installed into the instrument cabinet.

DESCRIPTION OF THE PRIOR ART

An instrument cabinet is previously known, in which a fan is arranged to provide airflow into the installation space of electric components to be installed into the instrument cabinet. Thermal stress produced by the electric components is thus transferred to the airflow. Because cooling arranged using only airflow requires large quantities of air, a cooling element is arranged in the airflow, and cooling fluid is fed through the flow channel of the cooling element. Air flowing through the cooling element thus cools down due to the cooling element, and the required amount of air is smaller. In this known solution, the cooling element is mounted horizontally, whereby it cools air flowing through it in the vertical direction.

One drawback with the above known solution is the provision of sufficient cooling power. In known solutions, the cooling element is placed horizontally in the instrument cabinet immediately below or above the electric components. To save space, the cooling element is usually thin, which means that air flowing through it does not necessarily have time to cool sufficiently. By making the cooling element thicker or by placing several cooling elements on top of each other, the cooling power can be increased. However, this increases the space required by the cooling element or cooling elements in the elevation direction of the instrument cabinet. The height of the instrument cabinet then needs to be increased so as to make the cabinet high enough for both the electric components and the cooling element. This makes the instrument cabinet unnecessarily big.

A cooling element also always involves the risk of leakage. If the cooling element is above electric components, the cooling fluid may damage the electric components if a leak occurs. It is also possible that cooling fluid flows upwards with airflow from a cooling element located below electric components to the installation space of the electric components. If several cooling elements are used in an instrument cabinet to obtain sufficient cooling power, the number of cooling fluid connections increases, as does the risk of leakage from these connections.

From DE publication 8,702,065 U1, a solution is also known, in which a Meander-type cooling element formed of a meandering cooling pipe is arranged partially between the vertical studs of an instrument cabinet's wall structure. In this known solution, however, the achieved cooling power is not satisfactory. In addition, the shape of the cooling element impedes airflow past the cooling element.

SUMMARY OF THE INVENTION

It is an object of this invention to solve the problem described above and provide a solution that enables efficient cooling of an instrument cabinet while minimizing the size of the instrument cabinet and the risks related to cooling fluid leakage. This object is achieved with an instrument cabinet according to the attached independent claim 1.

The present invention utilizes the unused space between the vertical studs of the instrument cabinet's wall structure as the location for the cooling element. When the cooling element is positioned upright, it is possible to locate at least part of the cooling element, and in the best case, the entire cooling element, in the space between the vertical studs. Positioning the cooling element upright means that the space it requires in elevation is larger than the space it requires in the lateral direction of the cabinet. In comparison with a prior-art cabinet, space becomes available above or below the electric components, because it is not necessary to arrange the cooling element there. Thus, the instrument cabinet can be lower than in the prior-art solution, which results in saving space. This also reduces the risk of damaging the electric components in the instrument cabinet as a result of a cooling fluid leakage, because any leaked fluid would not flow directly on the electric components or get transported with airflow to the installation space of the electric components.

The invention utilizes the principle of a counter flow exchanger wherein the cooling element is shaped in such a manner that cooling fluid flows through the cooling element vertically from bottom to top, i.e. in an opposite flow direction to the airflow at the cooling element.

Preferred embodiments of the instrument cabinet of the invention are disclosed in the attached dependent claims 2 to 7.

BRIEF DESCRIPTION OF THE FIGURES

In the following, the invention will be described in greater detail by way of an example and with reference to the attached figures, in which.

DESCRIPTION OF A FEW EMBODIMENTS

Figure 1:
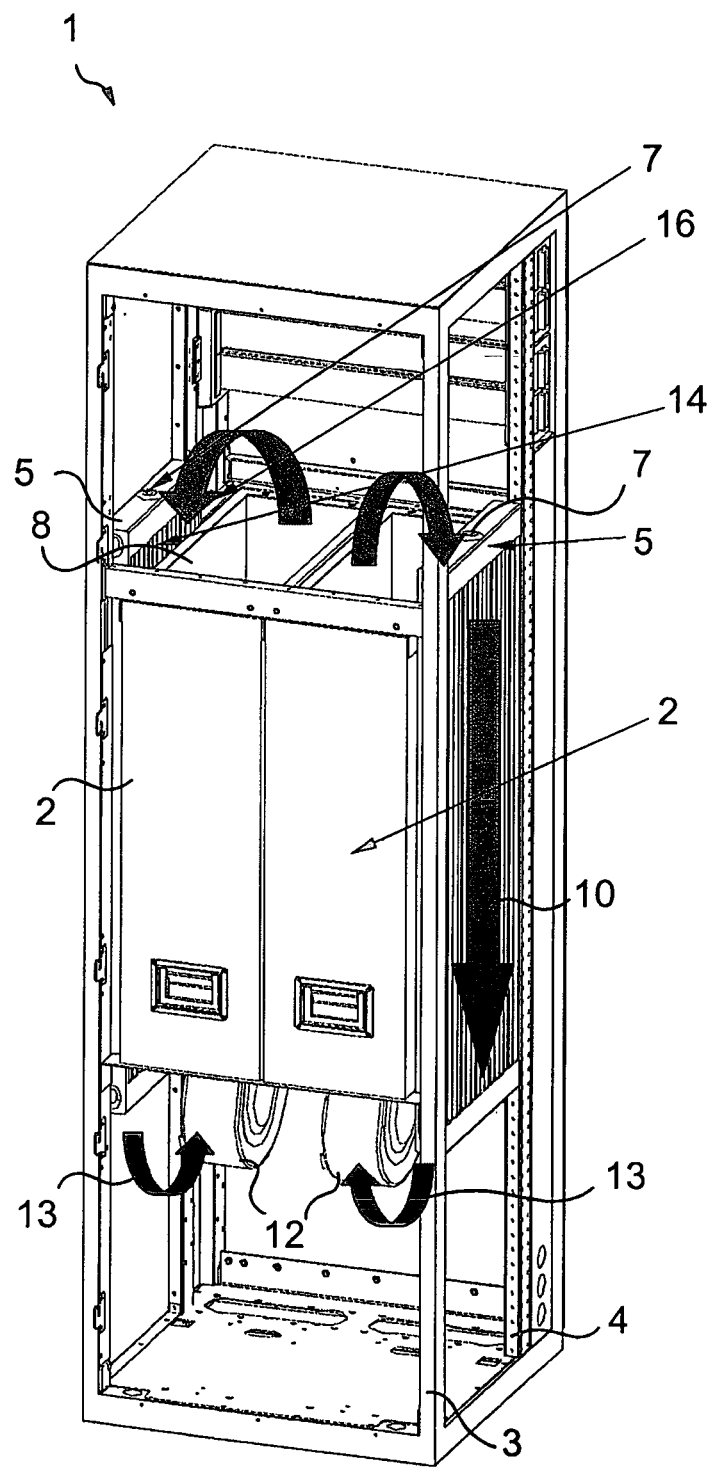
FIG. 1 shows a first preferred embodiment of an instrument cabinet of the invention.
Figure 2:
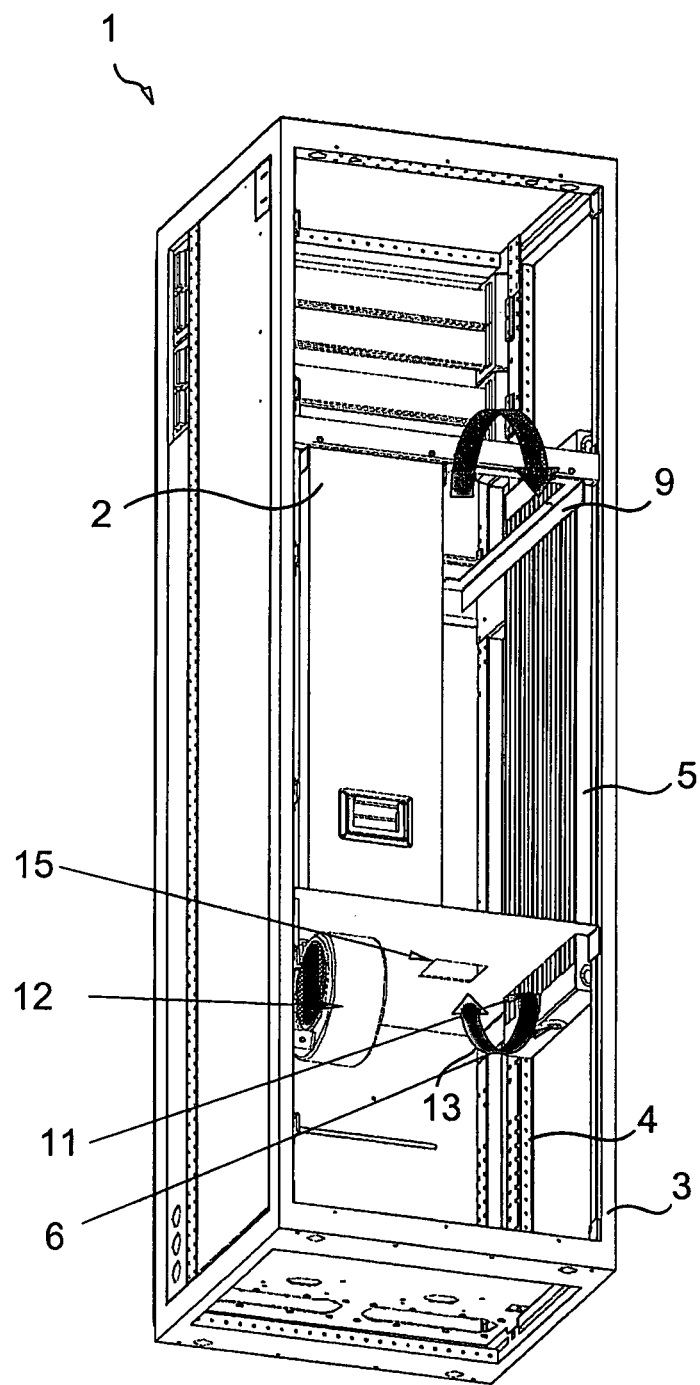
FIG. 2 illustrates details of the instrument cabinet of FIG. 1.

FIGS. 1 and 2 show a first preferred embodiment of the instrument cabinet 1 of the invention. In the following, it is assumed by way of example that the instrument cabinet 1 is for a frequency converter. In this embodiment, the electric components to be installed in the instrument cabinet are encased in specific modules 2, of which there are two in FIG. 1. The modules may be mounted on rails, for instance, in which case they can be pulled along the rails out of the instrument cabinet. In FIG. 2, the rightmost module 2 is removed to illustrate the details of the instrument cabinet 1. Differing from the example of the figures, the invention can also be utilized in a non-module instrument cabinet in which the electric components are fastened directly inside the instrument cabinet in a space intended for them.

In the figures, the instrument cabinet 1 is shown from the front, i.e. the devices in the instrument cabinet are visible through the opening on which the door of the instrument cabinet will be mounted. Vertical studs belonging to the structure of the sidewalls of the instrument cabinet 1 are thus visible on both left and right. In the following, only the rightmost vertical studs 3 and 4 are considered for the sake of simplicity. A plate forming the outer wall of the instrument cabinet is settled against the vertical studs 3 and 4 during the assembly of the instrument cabinet.

In accordance with the invention, a wall structure with vertical studs may be implemented in the manner shown in the figures, i.e. with separate vertical studs, against the surface of which a wall plate or wall plates are settled. Alternatively, in accordance with the invention, it is also possible to utilize a wall structure, in which vertical studs shaped into the wall plate form the vertical studs. In such a case, the wall plate is folded in such a manner that it has "cavities" that form the above-mentioned vertical studs of the wall structure.

In the embodiment of the figures, the empty, unused space between the vertical studs 3 and 4 is utilized by installing the cooling element 5 in the space. The cooling element 5 is turned upright, as shown in the figure, whereby it at least partly, preferably entirely, is in the space between the vertical studs. The cooling element 5 is also located inside the outer walls of the cabinet, whereby it does not increase the space required by the instrument cabinet.

In the embodiment of the figures, the bottom end of the cooling element 5 has an inlet 6 for receiving cooling fluid. The cooling fluid, preferably cooling liquid, such as water, flows from the inlet 6 through the flow channel of the cooling element to an outlet 7 at the top end of the cooling element and exits the cooling element through the outlet. The cooling element 5 has several substantially parallel channels through which the cooling fluid flows in the vertical direction. To simplify the figures, the pipes and the pump with which the cooling fluid is fed to the inlet and expelled through the outlet are not shown in the figures. The equipment with which the cooling fluid is cooled outside the instrument cabinet is also not shown in the figures. Said parts may be in accordance with the prior art.

The cooling element 5 is separated from the space containing electric components with at least one wall. In the case of FIG. 1, the wall or walls may be formed of the walls 8 of the modules 2. Then, if the cooling element 5 is dimensioned such that it fits in its entirety in the space between the vertical studs, the walls 8 of the modules may be arranged against the vertical studs 3 and 4 to separate the first flow channel in the cooling element 5 from the space containing the electric components of the instrument cabinet. Alternatively, it can be thought that a plate is fastened with fastening elements 9 inside the cooling element 5 to separate the cooling element from the space containing the electric components. The above-mentioned walls 8 (or the above-mentioned fastened plate) and the outer wall (side wall) of the instrument cabinet 1 form together a first part of the flow channel. Air flows through this first part of the flow channel in the direction indicated by arrow 10, i.e. downward in the longitudinal direction of the cooling element 5.

FIG. 2 shows that the cooling element 5 extends lower than the walls 8 of the modules 2. Thus, an opening 11 is formed at the bottom end, through which airflow can exit the first part of the flow channel. Air flows from the opening to a suction opening of a fan 12 in a manner shown indicated by arrow 13. An outlet of the fan 12 is, in turn, connected to an opening 15 from which air is blown to the installation space of the electric components, i.e. to the modules 2.

The fan 12 is preferably arranged as shown in the figures in such a manner that the airflow produced by the fan is directed straight to the space containing the electric components. The fan located below the space containing the electric components then efficiently blows the air cooled by the cooling element 5 directly into the space containing the electric components.

In the example of the figures, the walls of the modules 2 define a second part of the flow channel, through which cold air flows in such a manner that it cools the electric components in the installation space. At the top end of the modules 2, the cooling element 5 extends higher than the module walls 8, whereby an opening 14 is formed, through which warmed air can pass to the first part of the flow channel where the cooling element 5 again cools the airflow.

In the example of the figures, the cooling elements 5 do not extend to the back wall of the instrument cabinet 1 (like the modules 2 do). Therefore, barrier plates 16 are arranged between the cooling elements and the back wall to ensure that air does not leak to the wrong place. Air exiting the cooling element 5 thus flows to the installation space of the electric components, i.e. to the modules 2, and the air exiting the installation space of the electric components flows to the cooling element 5.

In the embodiment shown in the figures, the instrument cabinet 1 thus has a closed air circulation that is made relatively airtight with the barrier plate 16 and wall structures so that the same air would circulate continuously. This is advantageous wherein there is no need to arrange for separate suction piping for air intake from outside or an air filter for such piping. According to the invention, it is, however, also possible not to circulate the air but bring in new air continuously to the first part of the flow channel for cooling and to expel heated air from the second part of the flow channel through an outlet.

Above, it has been described with reference to the figures that airflow takes place in the longitudinal direction of the cooling element 5 from top to bottom wherein the cooling fluid, in turn, flows in the opposite direction through the cooling element, i.e. from bottom to top. This provides the most advantageous solution for cooling, i.e. the principle of a counter flow exchanger. In addition, the natural flow direction (up) of warm air flowing from a space containing the electric components will thus be taken into account and utilized.

The figures show by way of example that the instrument cabinet has two cooling elements in the space between the vertical studs. In practice, it is, however, possible to achieve sufficient cooling with a cooling element on one side only. The cooling element in question also does not need to be a one-piece element, as shown by way of example in the figures, and it is also possible to have several cooling elements arranged consecutively in the airflow direction to obtain a sufficient cooling power.

The direction of the cooling fins may also be different from the figures. The cooling element also does not need to be so high as to extend at both ends past the end point of the installation space for the electric components. A shorter cooling element can be used, in which the openings joining the first and second parts of the flow channel are shaped in a manner differing from the solution in the figures in such a manner that air can flow from the installation space to the cooling element and from its other end back to the installation space.

It should be understood that the above description and the related figures are only intended to illustrate the present invention. Several variations and modifications of the invention will be apparent to a person skilled in the art without departing from the scope of protection of the invention.

The invention claimed is:
1. An instrument cabinet comprising:
   a wall structure with vertical studs,
   a cooling element with a flow channel that comprises a group of substantially parallel channels for feeding cooling liquid in the vertical direction from bottom to top through the cooling element that is arranged upright and at least partly in the space between the vertical studs, at least one wall that separates the cooling element from a space containing electric components of the instrument cabinet, and between the wall and the wall structure of the instrument cabinet, there is a first part of the flow channel, in which air flowing through the flow channel is directed in the longitudinal direction of the cooling element from top to bottom, which is an opposite flow direction to the flow direction of the cooling liquid through the cooling element, and the space containing electric components forms a second part of the flow channel that is connected to the first part of the flow channel through openings at different heights, and a fan for cooling the electric components to be installed in the instrument cabinet with airflow produced by the fan, wherein the fan is located below the space containing the electric components, and draws air from the first part of the flow channel and to discharge air to the second part of the flow channel, and is aligned in such a manner that the airflow produced by the fan is directed directly upwards to the space containing the electric components.

2. The instrument cabinet as claimed in claim 1, wherein the cooling element is arranged with respect to a door of the instrument cabinet at least partly in the space between the vertical studs belonging to the sidewall structure.

* * * * *